(12) United States Patent
Tuttle

(10) Patent No.: US 6,452,253 B1
(45) Date of Patent: Sep. 17, 2002

(54) METHOD AND APPARATUS FOR MAGNETIC SHIELDING OF AN INTEGRATED CIRCUIT

(75) Inventor: Mark Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,997

(22) Filed: Aug. 31, 2000

(51) Int. Cl.[7] ................................................ H05K 1/00
(52) U.S. Cl. ........................................ 257/659; 257/687
(58) Field of Search ................................ 257/660, 659, 257/921, 687

(56) References Cited

U.S. PATENT DOCUMENTS

| 4,926,546 A | | 5/1990 | Polczynski et al. | |
| 4,953,002 A | | 8/1990 | Nelson et al. | |
| 5,275,975 A | | 1/1994 | Baudouin et al. | |
| 5,406,117 A | * | 4/1995 | Dlugokecki et al. | 257/660 |
| 5,561,265 A | * | 10/1996 | Lishits et al. | 174/32 |
| 6,097,080 A | * | 8/2000 | Nakanishi et al. | 257/660 |

FOREIGN PATENT DOCUMENTS

JP 60-244050 * 3/1985

* cited by examiner

*Primary Examiner*—Roy Potter
(74) *Attorney, Agent, or Firm*—Dickstein Shapiro Morin & Oshinsky LLP

(57) ABSTRACT

Disclosed are a method and apparatus which provide a magnetic shield for integrated circuits containing electromagnetic circuit elements. The shield is formed of a magnetically permeable material, which may be a non-conductive magnetic oxide, and either partially contacts or completely surrounds the integrated circuit.

33 Claims, 3 Drawing Sheets

METHOD AND APPARATUS FOR MAGNETIC SHIELDING OF AN INTEGRATED CIRCUIT

FIELD OF THE INVENTION

The present invention relates to a method and apparatus for shielding electromagnetic integrated circuits from external magnetic fields.

BACKGROUND OF THE INVENTION

A conventional integrated circuit (IC) package typically comprises (1) an IC chip or die including a plurality of input/output terminals; (2) a support for the chip, such as a pad, substrate or leadframe, including electrically conductive leads; (3) electrical connections such as wire bonds or conductive bumps for electrically connecting the input/output terminals of the chip with the electrically conductive leads; and (4) a material for encasing or encapsulating the chip, the support and the electrical connections while leaving portions of the leads accessible outside the casing or encapsulation. Fabrication of such a conventional IC package requires attaching the IC chip to the support, connecting the input/output terminals of the chip to the electrically conductive leads, and encapsulating the IC chip, the support and the electrical connections in, for example, a plastic package.

Recently, very high-density magnetic memories, such as magnetic random access memories (MRAMs), have been proposed to be integrated together with CMOS circuits. Magnetic random access memories employ one or more ferromagnetic films as storage elements. A typical multilayer-film MRAM includes a plurality of bit or digit lines intersected by a plurality of word lines. At each intersection, a ferromagnetic film is interposed between the corresponding bit line and word line to form a memory cell.

When in use, an MRAM cell stores information as digital bits, the logic value of which depends on the states of magnetization of the thin magnetic multilayer films forming each memory cell. As such, the MRAM cell has two stable magnetic configurations, high resistance representing, for example, a logic state 0 and low resistance representing, for example, a logic state 1. The magnetization configurations of the MRAMs depend in turn on the magnetization vectors which are oriented as a result of electromagnetic fields applied to the memory cells. The electromagnetic fields used to read and write data are generated by associated CMOS circuitry. However, stray magnetic fields, which are generated external to the MRAM, may cause errors in memory cell operation when they have sufficient magnitude.

Very high-density MRAMs are particularly sensitive to stray magnetic fields mainly because the minuscule MRAM cells require relatively low magnetic fields for read/write operations which, in turn, depend upon the switching or sensing of the magnetic vectors. These magnetic vectors are, in turn, easily affected and have the magnetic orientation changed by such external stray magnetic fields.

To diminish the negative effects of the stray magnetic fields and to avoid sensitivity of MRAM devices to stray magnetic fields, the semiconductor industry could introduce memory cells requiring higher switching electromagnetic fields than a stray field which the memory cells would typically encounter. However, the current requirements for operating such memory cells is greatly increased because higher internal fields necessitate more current. Thus, both the reliability and scalability of such high current devices decrease accordingly, and the use of MRAMs which may be affected by stray magnetic fields becomes undesirable.

Accordingly, there is a need for an improved magnetic memory structure and a method of forming it, which shields against external magnetic fields. There is also a need of a packaging device for encasing a magnetic random access memory IC chip which reduces the effects of external magnetic fields on internal memory cell structures and operations. There is further a need for minimizing the cost of a packaging which shields a magnetic random access memory IC chip from external magnetic fields.

SUMMARY OF THE INVENTION

The present invention provides a method and apparatus which provide a packaging device for magnetic memory structures, such as MRAMs, which shields such memory structures from external magnetic fields. The invention employs a magnetic shield, preferably formed of non-conductive magnetic oxides, which either partially contacts or completely surrounds an integrated circuit chip which includes such magnetic memory structures.

These and other features and advantages of the invention will be more clearly apparent from the following detailed description which is provided in connection with accompanying drawings and which illustrates exemplary embodiments of the invention.

DETAILED DESCRIPTION OF THE EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The present invention provides a method for fabricating packaging devices for electromagnetic integrated circuit structures, such as MRAM structures, to provide electromagnetic shields and to a shielded packaged electromagnetic integrated circuit structure. The present invention employs a magnetic shield, preferably formed of electrically non-conductive magnetic oxides, which either partially contacts or completely surrounds an integrated circuit chip which contains electromagnetic structures. In one exemplary embodiment of the invention, the magnetic shield is formed as a glob or layer of magnetic field shielding material which is affixed to one or more surfaces of an integrated circuit chip. In another exemplary embodiment, an encapsulating material of the chip packaging includes magnetic field shielding material therein.

Figure 1:
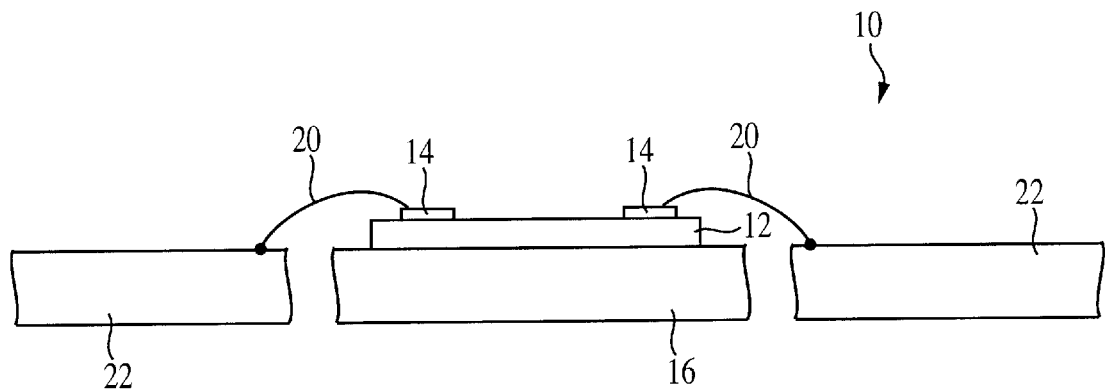
FIG. 1 is a cross-sectional view of an integrated circuit package assembly at an intermediate stage of processing and in accordance with a first exemplary embodiment of the present invention.

Referring now to the drawings, where like elements are designated by like reference numerals, FIGS. 1–4 illustrate exemplary embodiments of the present invention. FIG. 1 depicts an integrated circuit (IC) package assembly 10 at an intermediate stage of processing. A semiconductor chip or die 12 includes an array of input/output terminals 14 and internal electromagnetic structures, such as MRAM cells and access circuitry.

The chip 12 is supported by a die pad 16 (FIG. 1) which can be formed, for example, of a leadframe or a dielectric substrate. Each of the input/output terminals 14 is further electrically connected with respective conductive leads 22 by wire bonds 20, or other suitable electrical connectors.

Figure 2:
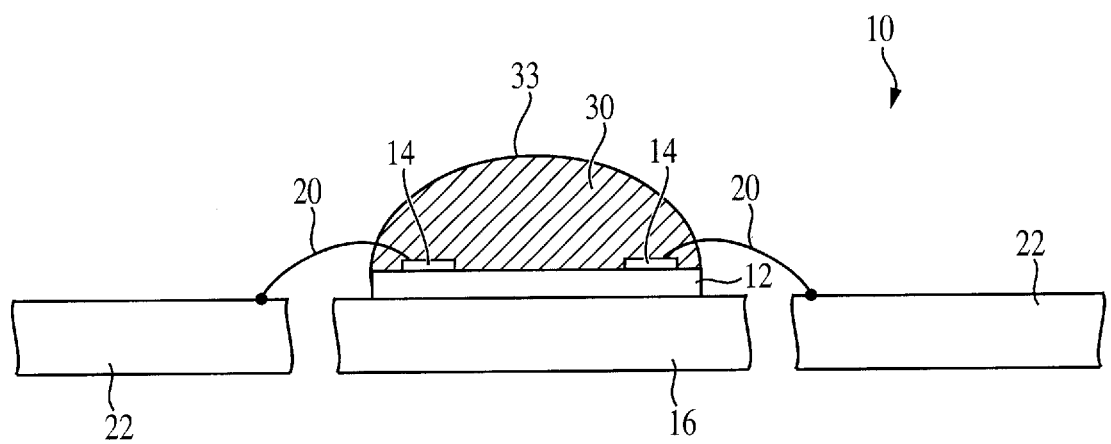
FIG. 2 is a cross-sectional view of the integrated circuit package assembly of FIG. 1 at a subsequent stage of processing to that shown in FIG. 1

Referring now to FIG. 2, a magnetic shield is provided for shielding the chip 12 from external magnetic field disturbances. According to a first exemplary embodiment of the present invention, a glob top 33 is formed over the semiconductor die 12, including the input/output terminals 14, and portions of the wire bonds 20. The glob top 33 comprises an electrically non-conductive magnetic shielding material 30, which can be injected, for example, from a nozzle. If desired, a mold can be used to shape the magnetic shielding material 30. If a mold is used, the magnetic shielding material 30 is injected into a cavity of the mold, and flows along the top of the chip 12, the input/output terminals 14 and adjacent portions of the wire bonds 20 which are within the mold cavity. Subsequent to the injection of the magnetic shielding material 30 into the mold cavity, the magnetic shielding material 30 hardens to form the glob top 33, as illustrated in FIG. 2. If a mold is not used, a nozzle can simply deposit a glob top 33 of material on the upper surface of chip 12.

The magnetic shielding material 30 may be formed, for example, of an electrically non-conductive material with permeability higher than that of air or silicon. As such, the preferred choice for the magnetic shielding material 30 is a non-conductive magnetic oxide, for example, a ferrite such as $MFe_2O_4$, wherein M=Mn, Fe, Co, Ni, Cu, or Mg, among others. Manganites, chromites and cobaltites may be used also, depending on the device characteristics and specific processing requirements.

Further, the magnetic shielding material 30 may be also composed of magnetic particles, for example nickel or iron particles, which are incorporated into a non-conducting molding material, for example a glass sealing alloy or a polyimide. Since nickel is conductive, the concentration of nickel particles in the glass alloy should be low enough so that shielding material 30 does not form a continuous conductor if the shield extends to the input/output terminals 14 or the wire bonds 20.

Figure 3:
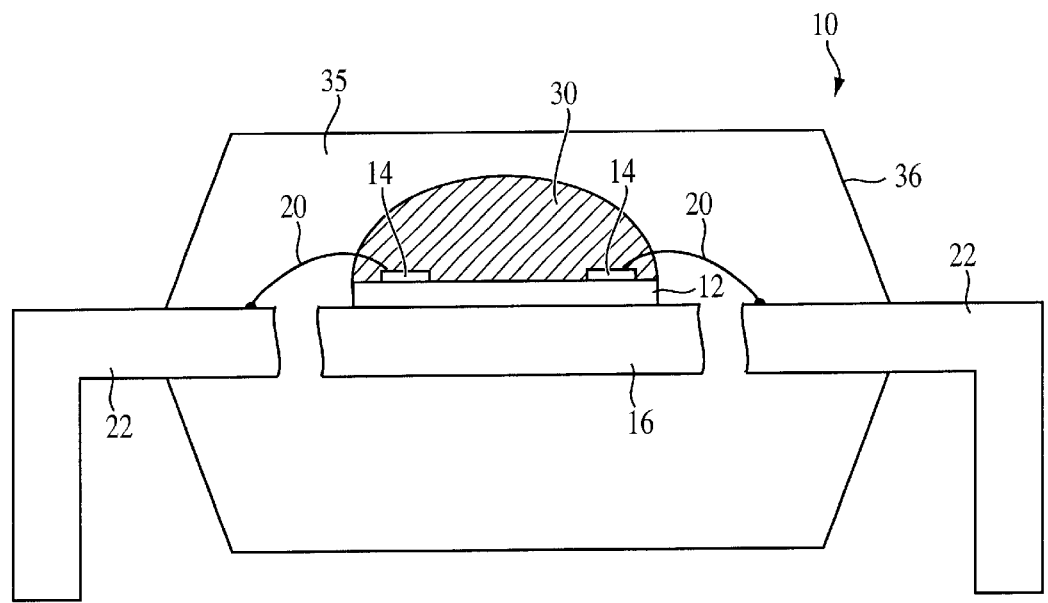
FIG. 3 is a cross-sectional view of the integrated circuit package assembly of FIG. 1 at a subsequent stage of processing to that shown in FIG. 2.

Next, as illustrated in FIG. 3, the structure of FIG. 2 is fulrther encapsulated into a packaging material 35, for example a plastic compound, which, as known in the art, may be injected into a mold cavity through a passage (not shown). As the packaging material 35 is injected, it flows around the glob top 33, portions of the wire bonds 20 and conductive leads 22, as well as around the die pad 16. This way, the input/output terminals 14 of integrated circuitry including magnetic memory structures, such as MRAMs, are shielded by the glob top 33 and encapsulated in the packaging material 35 for enhanced protection from external stray magnetic fields.

Further, for even maximum protection, the packaging material 35 may also comprise a mold compound, such as a plastic compound, with conductive magnetic particles therein. For example, conductive magnetic particles of, for example, nickel, iron, and/or cobalt, may be suspended in a matrix material, such as a plastic compound, at a concentration that does not allow the particles to touch and form a continuous shorting conductor between the leads. Alternatively, the packaging material 35 may comprise a mold compound, such as a plastic compound, including non-conductive particles of, for example, non-conductive magnetic oxides and/or Mumetal alloys, which may comprise approximately 77% nickel (Ni), 4.8% copper (Cu), 1.5% chromium (Cr) and 14.9% iron (Fe).

Figure 5:
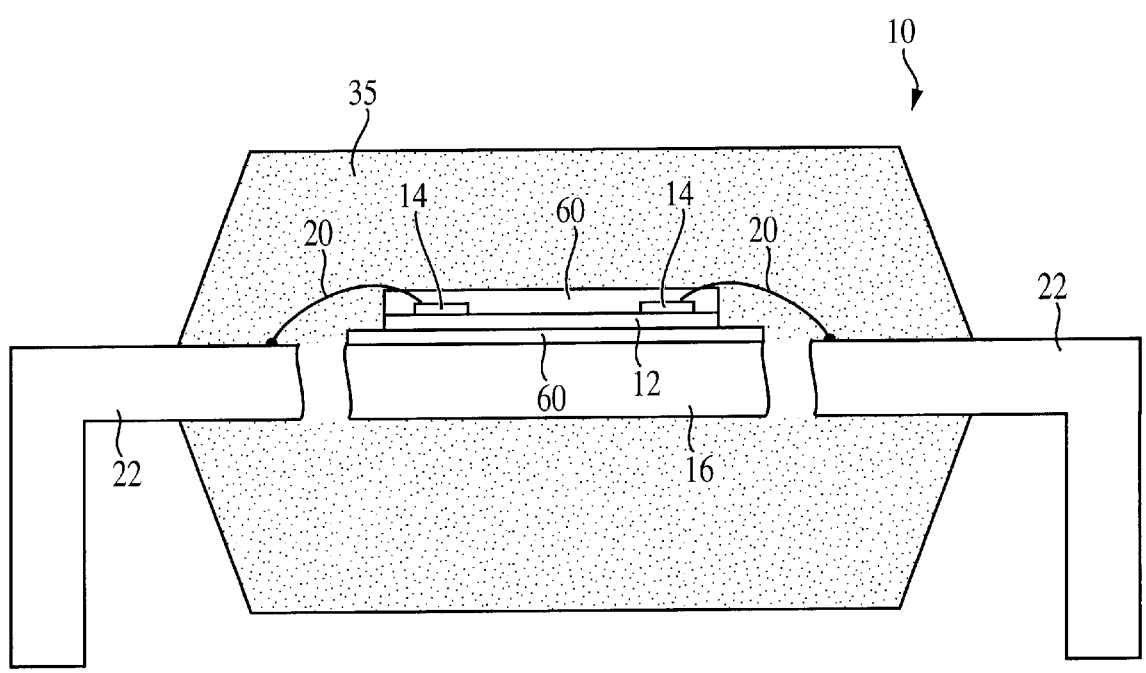
FIG. 5 is a cross-sectional view of the integrated circuit package assembly of FIG. 1 at a subsequent stage of processing and in accordance with a third embodiment of the present invention.

Although FIGS. 2 and 3 show the magnetic shielding material 30 in the form of a rounded glob top 33 on only the top of chip 12, it is also possible to apply a glob of shielding material 30 to the bottom surface instead, or to the top and bottom of chip 12. Moreover, if the material of choice for the die pad 16 is a dielectric substrate, it is also possible to apply a flat layer 60 of shielding material 30 to the bottom of the chip 12, as illustrated in FIG. 5. In this case, the bottom flat layer 60 of shielding material 30 may be conductive or non-conductive as needed, depending on the characteristics of the IC device. A non-conductive magnetic shielding material may employ a non-conductive oxide, for example a ferrite such as $MFe_2O_4$, wherein M=Mn, Fe, Co, Ni, Cu, or Mg, among others, manganites, chromites and/or cobaltites. Similarly, a conductive magnetic shielding material may be composed of Mumetal alloys comprising approximately 77% nickel (Ni), 4.8% copper (Cu), 1.5% chromium (Cr) and 14.9% iron (Fe), or magnetic particles, such as nickel or iron particles, which are incorporated into a non-conducting molding material, for example a glass sealing alloy or polyimide. If, however, the material of choice for the die pad 16 is a lead frame comprising a magnetic material, such as the commonly used alloy 42 which already provides magnetic shielding, then the bottom flat layer 60 is optional.

Figure 4:
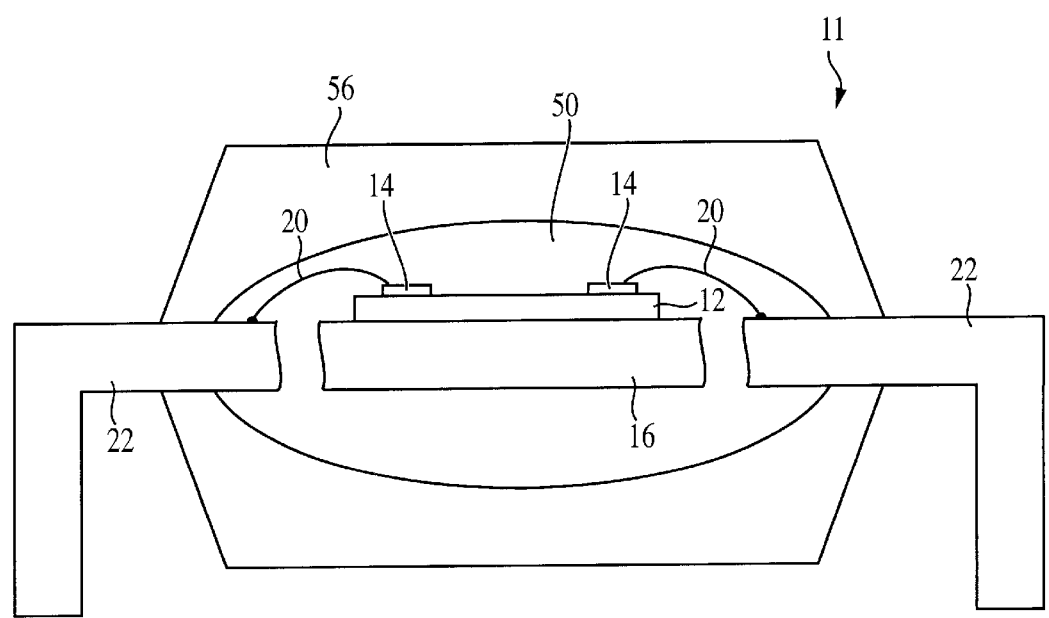
FIG. 4 is a cross-sectional view of the integrated circuit package assembly of FIG. 1 at a subsequent stage of processing and in accordance with a second embodiment of the present invention.

FIG. 4 illustrates yet another exemplary embodiment of the present invention, in which a magnetic shielding material 50 is formed as the chip 12 encapsulating material which is used to form an IC packaging assembly 11. The preferred material for the magnetic shielding material 50 is a non-conductive magnetic oxide, for example a ferrite such as $MFe_2O_4$, wherein M=Mn, Fe, Co, Ni, Cu, or Mg, among others. However, manganites, chromites and cobaltites may be used also, depending on the device characteristics and processing requirements. Further, conductive Mumetal alloys comprising approximately 77% nickel (Ni), 4.8% copper (Cu), 1.5% chromium (Cr) and 14.9% iron (Fe) may be used also, as well as conductive magnetic particles, such as nickel, iron or cobalt particles, incorporated into a molding material, for example a glass sealing alloy or a commercially available IC mold compound.

The magnetic shielding material 50 completely surrounds the semiconductor chip 12. A protective plastic packaging 56 (FIG. 4), such as a commercially available IC mold compound, is next optionally provided to completely surround the magnetic shielding material 50 and to complete the fabrication of the IC package assembly 11.

Although the exemplary embodiments described above refer to specific magnetic shielding materials it must be understood that the invention is not limited to the materials described above, and other magnetic shielding materials, such as ferromagnetics like nickel-iron (Permalloy), nickel or iron may be used also, as long as they are capable of shielding electromagnetic structures within chip 12 from external magnetic fields.

Further, although the exemplary embodiments described above refer to specific locations where the shielding material is applied to a die, it is also possible to apply the shielding material in other locations. For example, as described above, two globs 33 or layers of material could be employed for shielding the magnetic memories structures, one on each side of chip 12, or multiple globs or layers of the same or different shielding material which overlap each other may be used on one or both sides of chip 12. In addition, the specific shape of the shielding material is not limited to that shown in FIGS. 2–4 and other shapes, configurations, or geometries may be employed.

The present invention is thus not limited to the details of the illustrated embodiments and the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. An integrated circuit package comprising:
at least one integrated circuit device having at least one magnetic element which is sensitive to external magnetic fields; and
a magnetic field shielding material in contact with at least a portion of said device.

2. The package of claim 1, wherein said shielding material contacts said device on at least a surface of said device.

3. An integrated circuit package comprising:
at least one integrated circuit device sensitive to external magnetic fields; and
a magnetic field shielding material in contact with at least a portion of said device,
wherein said shielding material is in the form of a material glob on said device.

4. The package of claim 1, wherein said shielding material completely surrounds said device and forms an exterior packaging for said device.

5. The package of claim 1, wherein said shielding material comprises a magnetic material selected from the group consisting of ferrites, manganites, chromites and cobaltites.

6. The package of claim 1, wherein said magnetic material comprises $MFe_2O_4$, wherein M is at least one atom selected from the group consisting of Mn, Fe, Co, Ni, Cu, and Mg.

7. The package of claim 1, wherein said shielding material comprises a material which includes conductive magnetic particles.

8. An integrated circuit package comprising:
at least one integrated circuit device sensitive to external magnetic fields; and
a magnetic field shielding material in contact with at least a portion of said device,
wherein said shielding material comprises a material which includes nickel particles.

9. The package of claim 7, wherein said shielding material comprises a material which includes iron particles.

10. An integrated circuit package comprising:
at least one integrated circuit device sensitive to external magnetic fields; and
a magnetic field shielding material in contact with at least a portion of said device,
wherein said shielding material comprises a material which includes cobalt particles.

11. An integrated circuit package comprising:
at least one magnetic memory device; and
a magnetic field shielding material in contact with at least a portion of said magnetic memory device.

12. An integrated circuit package comprising:
at least one magnetic random access memory device; and
a magnetic field shielding material in contact with at least a portion of said magnetic random access memory device.

13. An integrated circuit structure comprising:
a plurality of external leads; and
a die electrically connected to said external leads, said die being enclosed by a packaging material and being in contact with a shielding material, said die further comprising a magnetic random access memory device.

14. The integrated circuit structure of claim 13, wherein said shielding material is part of said packaging material.

15. The integrated circuit structure of claim 14, wherein said shielding material is in the form of a glob on said die.

16. The integrated circuit structure of claim 13, wherein said shielding material is in the form of said packaging material.

17. The integrated circuit structure of claim 13, wherein said shielding material comprises a magnetic material selected from the group consisting of ferrites, manganites, chromites and cobaltites.

18. The integrated circuit structure of claim 13, wherein said magnetic material comprises $MFe_2O_4$, wherein M is at least one atom selected from the group consisting of Mn, Fe, Co, Ni, Cu, and Mg.

19. The integrated circuit structure of claim 13, wherein said shielding material comprises a material which includes conductive magnetic particles.

20. The integrated circuit structure of claim 19, wherein said shielding material comprises a material which includes nickel particles.

21. The integrated circuit structure of claim 19, wherein said shielding material comprises a material which includes iron particles.

22. The integrated circuit structure of claim 19, wherein said shielding material comprises a material which includes cobalt particles.

23. An integrated circuit package comprising:
at least one integrated circuit device having at least one magnetic element which is sensitive to external magnetic fields; and
a magnetic field shielding material completely surrounding said device and forming an exterior packaging for said device.

24. An integrated circuit package comprising:
at least one integrated circuit device having at least one magnetic element which is sensitive to external magnetic fields; and
a magnetic field shielding material in contact with at least a portion of said device, said magnetic filed shielding material comprising a magnetic material selected from the group consisting of ferrites, manganites, chromites and cobaltites.

25. An integrated circuit package comprising:
at least one integrated circuit device having at least one magnetic element which is sensitive to external magnetic fields; and
a magnetic field shielding material in contact with at least a portion of said device, said magnetic field shielding material comprising $MFe_2O_4$, wherein M is at least one atom selected from the group consisting of Mn, Fe, Co, Ni, Cu, and Mg.

26. An integrated circuit package comprising:

at least one integrated circuit device having at least one magnetic element which is sensitive to external magnetic fields; and a magnetic field shielding material for said device including nickel particles, said nickel particles being supported in a non-conducting binding material.

27. An integrated circuit package comprising:

at least one integrated circuit device having at least one magnetic element which is sensitive to external magnetic fields; and a magnetic field shielding material for said device including iron particles, said iron particles being supported in a non-conducting binding material.

28. An integrated circuit package comprising:

at least one integrated circuit device having at least one magnetic element which is sensitive to external magnetic fields; and a magnetic field shielding material for said device including cobalt particles, said cobalt particles being supported in a non-conducting binding material.

29. An integrated circuit structure comprising:

a plurality of external leads; and a die electrically connected to said external leads, said die being enclosed by a packaging material and being protected by a magnetic field shielding material, said magnetic filed shielding material being in the form of a glob provided over at least one surface of said die, said die further comprising a magnetic random access memory device.

30. An integrated circuit structure comprising:

a plurality of external leads; and a die electrically connected to said external leads, said die being enclosed by a packaging material and being in contact with a shielding material, said die further comprising a magnetic random access memory device, and wherein said magnetic material comprises $MFe_2O_4$, wherein M is at least one atom selected from the group consisting of Mn, Fe, Co, Ni, Cu, and Mg.

31. An integrated circuit structure comprising:

a plurality of external leads; and a die electrically connected to said external leads, said die being enclosed by a packaging material and being protected by a shielding material comprising nickel particles, said die further comprising a magnetic random access memory device.

32. An integrated circuit structure comprising:

a plurality of external leads; and a die electrically connected to said external leads, said die being enclosed by a packaging material and being protected by a shielding material comprising iron particles, said die further comprising a magnetic random access memory device.

33. An integrated circuit structure comprising:

a plurality of external leads; and a die electrically connected to said external leads, said die being enclosed by a packaging material and being protected by a shielding material comprising cobalt particles, said die further comprising a magnetic random access memory device.

* * * * *